US009594119B2

(12) United States Patent
Wiszniewski et al.

(10) Patent No.: US 9,594,119 B2
(45) Date of Patent: Mar. 14, 2017

(54) CIRCUIT ARRANGEMENT AND PROCESS FOR DETECTING A SWITCH POSITION

(71) Applicant: Robert Bosch GmbH, Stuttgart (DE)

(72) Inventors: Jacek Wiszniewski, Leinfelden-Echterdingen (DE); Kamil Pogorzelski, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 144 days.

(21) Appl. No.: 14/361,987

(22) PCT Filed: Oct. 22, 2012

(86) PCT No.: PCT/EP2012/070855
§ 371 (c)(1),
(2) Date: May 30, 2014

(87) PCT Pub. No.: WO2013/087269
PCT Pub. Date: Jun. 20, 2013

(65) Prior Publication Data
US 2014/0361779 A1    Dec. 11, 2014

(30) Foreign Application Priority Data

Dec. 13, 2011 (DE) .......................... 10 2011 088 411

(51) Int. Cl.
*G01R 31/327* (2006.01)
*H01H 9/16* (2006.01)

(52) U.S. Cl.
CPC ......... *G01R 31/3278* (2013.01); *H01H 9/167* (2013.01)

(58) Field of Classification Search
CPC .......... G01R 31/327; G05F 1/10; H02H 11/00
See application file for complete search history.

(56) References Cited

U.S. PATENT DOCUMENTS 5,057,699 A * 10/1991 Spence .............. G05B 19/0423
307/98
6,130,813 A * 10/2000 Kates ..................... H02H 9/001
307/80

(Continued)

FOREIGN PATENT DOCUMENTS

DE     198 17 291 A1    10/1999
DE     697 20 816 T2    11/2003

(Continued)

OTHER PUBLICATIONS

International Search Report corresponding to PCT Application No. PCT/EP2012/070855, mailed Apr. 24, 2013 (German and English language document) (9 pages).

(Continued)

*Primary Examiner* — Huy Q Phan
*Assistant Examiner* — Alvaro Fortich
(74) *Attorney, Agent, or Firm* — Maginot, Moore & Beck LLP

(57) ABSTRACT

A circuit arrangement for detecting a switch position includes a first node configured to be connected to one phase of a power network, a third node, and a micro-controller. A switch is arranged between the first node and the third node. A resistor is arranged parallel to the switch between the first node and the third node. A connection on the micro-controller is connected to the third node. The micro-controller is programmed to compare a voltage present at the connection against a reference voltage and to determine from this comparison whether the switch is open or closed.

9 Claims, 1 Drawing Sheet

(56) References Cited

U.S. PATENT DOCUMENTS

| | | | | |
|---|---|---|---|---|
| 6,193,019 | B1* | 2/2001 | Sirigu | B66B 13/22 |
| | | | | 187/391 |
| 6,232,781 | B1* | 5/2001 | Goser | F02D 41/221 |
| | | | | 324/415 |
| 7,112,900 | B2* | 9/2006 | Brotto | H02P 1/18 |
| | | | | 307/326 |
| 7,411,317 | B2* | 8/2008 | Liu | H02H 3/12 |
| | | | | 307/112 |
| 2003/0117095 | A1* | 6/2003 | Gorti | H02P 6/085 |
| | | | | 318/275 |
| 2009/0256534 | A1* | 10/2009 | Videtich | H02M 3/156 |
| | | | | 323/235 |
| 2009/0267651 | A1* | 10/2009 | Maimone | H03M 11/24 |
| | | | | 327/63 |
| 2011/0169496 | A1* | 7/2011 | Fried | B60Q 11/005 |
| | | | | 324/503 |
| 2011/0311237 | A1* | 12/2011 | Hotogi | G03G 15/80 |
| | | | | 399/9 |

FOREIGN PATENT DOCUMENTS

| | | |
|---|---|---|
| DE | 10 2006 033 705 B3 | 1/2008 |
| EP | 0 252 816 A1 | 1/1988 |
| EP | 0 336 051 A2 | 10/1989 |

OTHER PUBLICATIONS

Perme, Tom; AN1072, Measuring VDD Using the 0.6V Reference; 2007; Microchip Technology Inc. (10 pages).

* cited by examiner

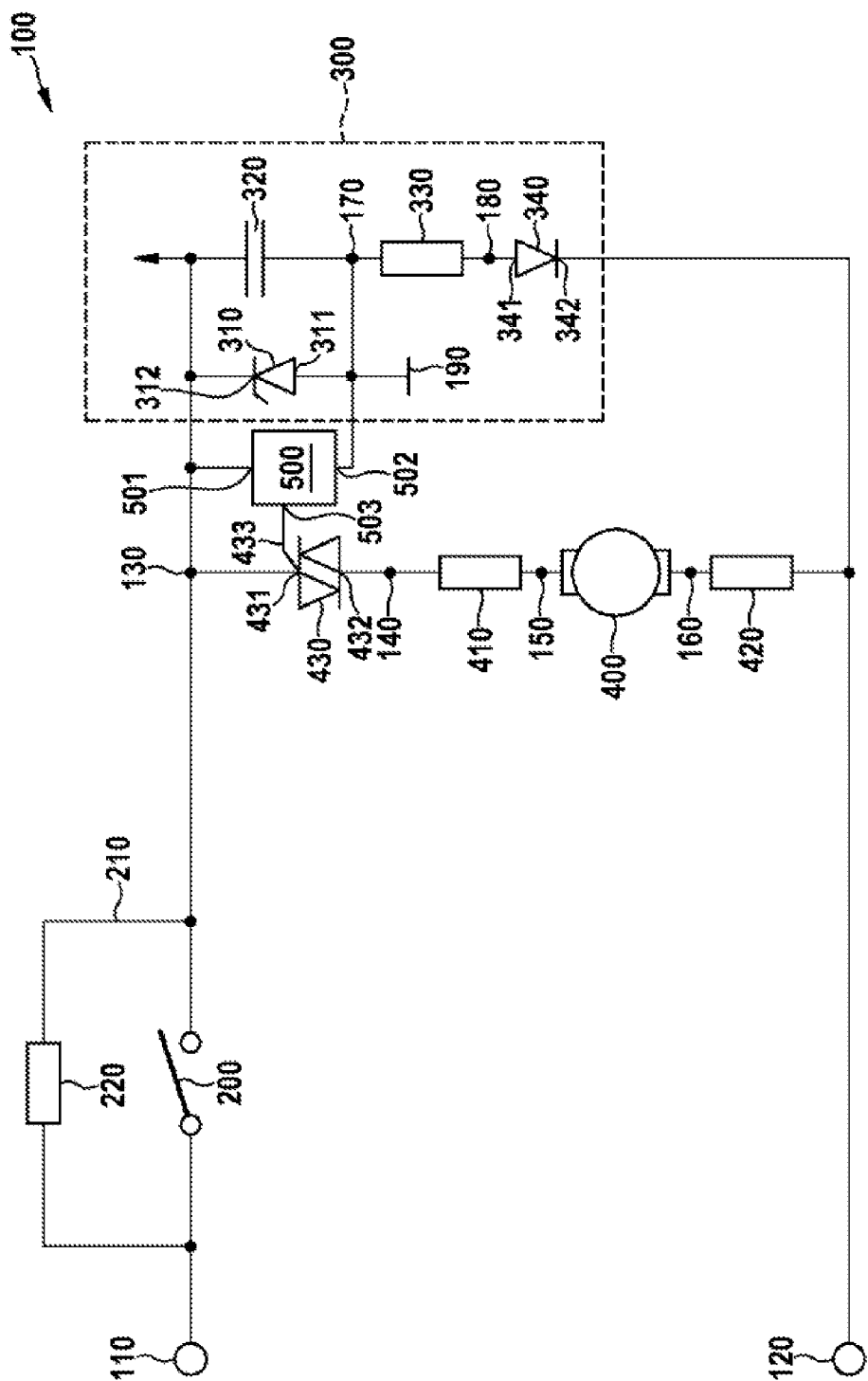

CIRCUIT ARRANGEMENT AND PROCESS FOR DETECTING A SWITCH POSITION

This application is a 35 U.S.C. §371 National Stage Application of PCT/EP2012/070855, filed on Oct. 22, 2012, which claims the benefit of priority to Serial No. DE 10 2011 088 411.4, filed on Dec. 13, 2011 in Germany, the disclosures of which are incorporated herein by reference in their entirety.

BACKGROUND

The disclosure relates to a circuit arrangement for detecting a switch position, to an electrical apparatus having such a circuit arrangement and to a method for detecting a switch position.

It is known to provide electrical devices with switches in order to switch the devices on and off. Continuously powered electrical devices, which still draw electrical energy even in the switched-off state, are also known. It is known to equip such electrical devices with apparatuses which are used to detect a switch position of the switch. By way of example, the detection can take place indirectly via a voltage present at a triac, or directly via a signal sent from the switch. In the case of all of said solutions, specially provided electrical and electronic components are necessary to detect the switch position. It is also known to connect resistors in parallel with switches in order to continuously supply power to electronics, for example in the case of machines with restart protection and current limiting at the carbon-brush apparatus.

SUMMARY

A problem addressed by the present disclosure therefore consists in providing an improved circuit arrangement for detecting a switch position. Said problem is solved by means of a circuit arrangement having the features of the disclosure. Another problem addressed by the present disclosure is to provide an electrical device having such a circuit arrangement. Said problem is solved by means of an electrical device having the features of the disclosure. A further problem addressed by the present disclosure is to specify a method for detecting a switch position. Said problem is solved by means of a method having the features of the disclosure. Preferred developments are specified in the dependent claims.

A circuit arrangement according to the disclosure for detecting a switch position comprises a first node, which can be connected to a phase of an electrical grid, a third node and a microcontroller. In this case, a switch is arranged between the first node and the third node. A resistor is arranged in parallel with the switch between the first node and the third node. A connection of the microcontroller is connected to the third node. The microcontroller is programmed to compare a voltage present at the connection with a reference voltage and, on the basis of said comparison, to determine whether the switch is open or closed. Advantageously, in the case of this circuit arrangement, it is possible to detect the switch position using the microcontroller without additional electronic components having to be provided. As a result, the circuit arrangement is advantageously particularly cost-effective to produce.

In a development of the circuit arrangement, the microcontroller has an analog-to-digital converter, wherein the reference voltage is used as reference value for the analog-to-digital converter. In this case, the microcontroller is programmed to digitize the voltage present at the connection by means of the analog-to-digital converter in order to obtain a digital value. In this case, the microcontroller is also programmed to determine, on the basis of the digital value, whether the switch is open or closed. Advantageously, an analog-to-digital converter which is present anyway in the microcontroller is then used to detect the switch position.

In a particularly preferred embodiment of the circuit arrangement, the connection of the microcontroller is a voltage supply connection of the microcontroller. Advantageously, no other connections of the microcontroller, in particular no IO connections of the microcontroller, are then required for detecting the switch position.

It is likewise preferred for the reference voltage to be an internal reference voltage of the microcontroller. Advantageously, it is then not necessary to supply the reference voltage to the microcontroller from the outside, as a result of which the design of the circuit arrangement is simplified.

In a development of the circuit arrangement, said circuit arrangement has a second node, which can be connected to a neutral conductor of an electrical grid. In this case, the circuit arrangement also has a seventh node, which is connected to a ground potential. In this case, an anode of a Zener diode is connected to the seventh node and a cathode of the Zener diode is connected to the third node. Furthermore, a capacitor is arranged between the third node and the seventh node. Further, a ground connection of the microcontroller is connected to the seventh node. In addition, a resistor and a diode are connected in series between the seventh node and the second node. Advantageously, the circuit arrangement can then provide, at the third node, a DC supply voltage for downstream circuit parts.

In an additional development of the circuit arrangement, a triac and an electric motor are connected in series between the third node and the second node. In this case, the microcontroller is designed to switch the triac. Advantageously, the microcontroller and the triac can then drive the electric motor by means of a phase gating controller for power regulation or control.

An electrical device according to the disclosure has a circuit arrangement of the type mentioned above. Advantageously, the electrical device can then detect a switch position of a switch without needing to have additional components for this purpose.

A method according to the disclosure for detecting a switch position has steps for calculating a ratio between a voltage value and a reference voltage, for detecting that the switch is open if the ratio falls below a fixed threshold value and for detecting that the switch is closed if the ratio does not fall below the fixed threshold value. Advantageously, the method can be implemented by a microcontroller.

In a development of the method, the ratio is calculated by digitizing the voltage value, wherein the reference voltage is used as reference value for the digitization. Advantageously, the digital signal can then be processed further in a simple manner.

In an expedient embodiment of the method, the voltage value is acquired by means of a voltage supply connection of a microcontroller. Advantageously, no other electronic components are then necessary in addition to the microcontroller in order to implement the method.

BRIEF DESCRIPTION OF THE DRAWINGS

The disclosure will now be explained in more detail on the basis of the attached FIGURE, in which:

FIG. 1 shows a circuit arrangement for detecting a switch position.

DETAILED DESCRIPTION

FIG. 1 shows a circuit diagram of a circuit arrangement 100. The circuit arrangement 100 can be used, for example, in an electrical device in order to detect a switch position of a switch of the electrical device. The electrical device can be, for example, a power tool, for example a drill or an angle grinder.

The circuit arrangement 100 has a first circuit node 110 and a second circuit node 120. The nodes 110, 120 are intended to be connected to an AC grid. In this case, the first node 110 is connected to a phase (L) of the electrical grid and the second node 120 is connected to a neutral conductor (N) of the AC grid, or vice versa.

A switch 200 is arranged between the first node 110 of the circuit arrangement 100 and a downstream third node 130 of the circuit arrangement 100. The switch 200 can be closed in order to conductively connect the first node 110 to the third node 130. The switch 200 can be opened in order to interrupt a direct connection between the first node 110 and the third node 130. The switch 200 can be, for example, a power switch of an electrical device in which the circuit arrangement 100 is provided.

A standby line 210 is connected in parallel with the switch 200, with a standby resistor 220 being arranged in said standby line. The standby line 210 comprising the standby resistor 220 is thus likewise arranged between the first node 110 and the third node 130. The standby line 210 is used to supply electrical voltage to the electronics in which the circuit arrangement 100 is arranged, even in the switched-off state, that is to say when the switch 200 is open. Such a voltage supply even in the switched-off state is necessary in the case of many electrical devices with continuously powered electronics. The standby resistor 220 can be used to limit a current flow in the switched-off state of the electrical device. The standby resistor 220 arranged in the standby line 210 is also used to detect the switch position of the switch 200, as explained below.

A switch can also be arranged between the second node 120 and downstream circuit parts of the circuit arrangement 100. A switch arranged between the second node 120 and downstream circuit parts can be coupled to the switch 200 such that the two switches always have a uniform switch position. However, a switch arranged between the second node 120 and downstream circuit parts of the circuit arrangement 100 can be omitted, as in the example illustrated in FIG. 1.

The circuit arrangement 100 has a switched-mode power supply 300 which is used to generate a DC supply voltage at the third node 130. Said DC supply voltage can be used by an electrical device in which the circuit arrangement 100 is arranged to supply power to other circuits and components.

The switched-mode power supply 300 has a seventh circuit node 170 which is connected to a ground potential 190. A Zener diode 310 is arranged between the third node 130 and the seventh node 170. In this case, the anode 311 of the Zener diode 310 is connected to the seventh node 170. The cathode 312 of the Zener diode 310 is connected to the third node 130. A capacitor 320 is also arranged between the third node 130 and the seventh node 170. The capacitor 320 is therefore connected in parallel with the Zener diode 310. The capacitor 320 can be, for example, an electrolytic capacitor. In addition, a series circuit comprising a resistor 330 and a diode 340 is arranged between the seventh node 170 and the second node 120. In this case, an anode 341 of the diode 340 is oriented in the direction of the seventh node 170, while a cathode 342 of the diode 340 is oriented in the direction of the second node 120. In the exemplary embodiment illustrated in FIG. 1, the resistor 330 is arranged between the seventh node 170 and an eighth node 180. The diode 340 is arranged between the eighth node 180 and the second node 120. The sequence of resistor 330 and diode 340 could also be changed, however.

The diode 340 of the switched-mode power supply 300 causes the capacitor 320 to be charged up only during one half-cycle of an AC voltage present between the first node 110 and the second node 120. During each second half-cycle of the AC voltage present between the first node 110 and the second node 120, the diode 340 turns off. The resistor 330 acts as current limiter. The Zener diode 310 limits the maximum electrical voltage to which the capacitor 320 is charged. For this purpose, the breakdown voltage of the Zener diode 310 can be, for example, 5.1 V.

In the example illustrated in FIG. 1, the circuit arrangement 100 additionally comprises an electric motor 400 which can be driven by means of a triac 430. The electric motor 400 can be an electric motor of an electrical device, for example a drill. The triac 430 and the electric motor 400 are connected in series. In the example shown in FIG. 1, the triac 430 is arranged between the third node 130 and a fourth node 140 of the circuit arrangement. In this case, a first electrode 431 of the triac 430 is connected to the third node 130. A second electrode 432 of the triac 430 is connected to the fourth node 140. The electric motor 400 is arranged between the fourth node 140 and the second node 120. FIG. 1 illustrates a series circuit comprising the electric motor 400, a first coil 410 and a second coil 420. In this case, the first coil 410 is arranged between the fourth node 140 and a fifth node 150 of the circuit arrangement 100. The electric motor 400 is arranged between the fifth node 150 and a sixth node 160 of the circuit arrangement 100. The second coil 420 is arranged between the sixth node 160 and the second node 120.

Moreover, the circuit arrangement 100 comprises a microcontroller 500. In the example shown in FIG. 1, the microcontroller 500 has a connection 501, a ground connection 502 and a control connection 503. The ground connection 502 is connected to the seventh node 170 and hence to the ground potential 190. The control connection 503 is connected to a control electrode 433 of the triac 430. The connection 501 is connected to the third node 130 of the circuit arrangement 100.

By means of the control connection 503 and the control electrode 433 of the triac 430, the microcontroller 500 can switch the triac 430 into a conducting state between the first electrode 431 and the second electrode 432. This is used by the microcontroller 500 to drive the electric motor 400 by means of a phase gating controller and to regulate or to control the power of the electric motor 400.

The connection 501 of the microcontroller 500 is preferably a voltage supply connection of the microcontroller 500. Therefore, the microcontroller 500 is supplied with energy via the connection 501. According to the disclosure, the microcontroller 500 also detects, via the electrical voltage present at the connection 501 of said microcontroller, whether the switch 200 is open or closed.

If the switch 200 of the circuit arrangement 100 is open, some of the electrical voltage which is present at the first node 110 of the circuit arrangement 100 is dropped across the standby resistor 220. As a result, the voltage present at the third node 130 of the circuit arrangement 100 is lower than the voltage present at the first node 110 of the circuit arrangement 100. If the switch 200 of the circuit arrangement 100 is closed, however, the standby resistor 220 is short-circuited, with the result that there is practically no voltage drop across the standby resistor 220. In this case, the electrical voltage present at the third node 130 substantially corresponds to the electrical voltage present at the first node 110 of the circuit arrangement 100 and is greater than the electrical voltage present at the third node 130 when the switch 200 is open.

The microcontroller 500 has an internal reference voltage. Additionally, the microcontroller 500 has the possibility of digitizing, by means of an analog-to-digital converter, the voltage value of the electrical voltage present at the connection 501 of said microcontroller and of using the internal reference voltage of the microcontroller 500 as reference value in this case. A procedure such as this is described, for example, in the document "Application Note AN1072" by Microchip. The digital value supplied by the analog-to-digital converter of the microcontroller 500 then gives a ratio of the magnitude of the voltage present at the connection 501 of the microcontroller 500 to the magnitude of the reference voltage. The actual value of the reference voltage is unimportant here, as long as the reference voltage is constant, less than the voltage present at the connection 501 and greater than the ground potential.

The digital value supplied by the analog-to-digital converter of the microcontroller 500 has different values depending on whether the switch 200 is open or closed. If the switch 200 is closed, the ratio of the voltage at the connection 501 to the reference voltage of the microcontroller 500 is higher and the digital value has a high value. If the switch 200 is open, the ratio of the voltage present at the connection 501 of the microcontroller 500 to the reference voltage of the microcontroller 500 is lower and the digital value has a lower value. The microcontroller 500 compares the digital value to a threshold value stored in the microcontroller 500. If the digital value is below the fixed threshold value, the microcontroller 500 infers from this that the switch 200 is open. Otherwise, the microcontroller 500 concludes that the switch 200 is closed.

A particular advantage of the circuit arrangement 100 consists in that no additional components and no additional connections of the microcontroller 500 are necessary for detecting the position of the switch 200. All components of the circuit arrangement 100 are necessary for operating an electrical device which has the circuit arrangement 100, even without the possibility of detecting the position of the switch 200. The connection 501 of the microcontroller 500 must be connected to the third node 130 of the circuit arrangement 100 anyway in order to supply the microcontroller 500 with electrical voltage. In addition, according to the disclosure, the position of the switch 200 can be detected merely by means of suitable programming of the microcontroller 500.

By way of example, the microcontroller 500 can use the knowledge of the position of the switch 200 to implement restart protection of an electrical device in which the circuit arrangement 100 is provided.

The invention claimed is:

1. A circuit arrangement for detecting a switch position, comprising:
   a first node configured to be connected to a phase of an electrical grid;
   a second node configured to be connected to a neutral conductor of an electrical grid;
   a third node;
   a fourth node connected to a ground potential;
   a switch connected between the first node and the third node, the switch being configured to establish a current path from the first node to the third node when the switch is closed;
   a Zener diode having an anode connected to the fourth node and a cathode connected to the third node;
   a capacitor arranged between the third node and the fourth node;
   a first resistor arranged in parallel with the switch between the first node and the third node;
   a second resistor and a diode connected in series between the fourth node and the second node; and
   a microcontroller connected to a voltage the third node, a ground connection of the microcontroller being connected to the fourth node, the microcontroller being configured to:
      compare the voltage at the third node with a predetermined reference voltage; and
      determine, on the basis of said comparison, whether the switch is open and whether the switch is closed.

2. The circuit arrangement as claimed in claim 1, wherein:
   the microcontroller has an analog-to-digital converter,
   the reference voltage is used as reference value for the analog-to-digital converter,
   the microcontroller is further configure to:
      digitize the voltage at the third node with the analog-to-digital converter in order to obtain a digital value, and
      determine, on the basis of the digital value, whether the switch is open and whether the switch is closed.

3. The circuit arrangement as claimed in claim 1, wherein the voltage at the third node acts as a voltage supply for the microcontroller.

4. The circuit arrangement as claimed in claim 1, wherein the reference voltage is an internal reference voltage of the microcontroller.

5. The circuit arrangement as claimed in claim 1, wherein a triac and an electric motor are connected in series between the third node and the second node, and wherein the microcontroller is configured to switch the triac.

6. An electrical apparatus, comprising:
   a circuit arrangement configured to detect a switch position, the circuit arrangement including:
      a first node configured to be connected to a phase of an electrical grid;
      a second node configured to be connected to a neutral conductor of an electrical grid;
      a third node;
      a fourth node connected to a ground potential;
      a switch connected between the first node and the third node, the switch being configured to establish a current path from the first node to the third node when the switch is closed;
      a Zener diode having an anode connected to the fourth node and a cathode connected to the third node;
      a capacitor arranged between the third node and the fourth node;
      a first resistor arranged in parallel with the switch between the first node and the third node;
      a second resistor and a diode connected in series between the fourth node and the second node; and
      a microcontroller connected to a voltage at the third node, a ground connection of the microcontroller being connected to the fourth node, the microcontroller being configured to:

compare the voltage at the third node with a predetermined reference voltage; and determine, on the basis of said comparison, whether the switch is open and whether the switch is closed.

7. A method for detecting a switch position in a circuit arrangement having (i) a first node configured to be connected to a phase of an electrical grid, (ii) a third node, (iii) a switch connected between the first node and the third node, the switch being configured to establish a current path from the first node to the third node when the switch is closed, and (iv) a microcontroller connected to a voltage at the third node, the method comprising:

calculating, with the microcontroller, a ratio between the voltage at the third node and a predetermined reference voltage;

detecting, with the microcontroller, that the switch is open if the ratio falls below a fixed threshold value; and detecting, with the microcontroller, that the switch is closed if the ratio does not fall below the fixed threshold value.

8. The method as claimed in claim 7, wherein the ratio is calculated by digitizing the voltage value, and wherein the reference voltage is used as reference value for the digitization.

9. The method as claimed in claim 7, wherein the voltage at the third node acts as a voltage supply for the microcontroller.

* * * * *

UNITED STATES PATENT AND TRADEMARK OFFICE
CERTIFICATE OF CORRECTION

PATENT NO. : 9,594,119 B2
APPLICATION NO. : 14/361987
DATED : March 14, 2017
INVENTOR(S) : Jacek Wiszniewski Page 1 of 1

It is certified that error appears in the above-identified patent and that said Letters Patent is hereby corrected as shown below:

In the Claims

In Column 6, Lines 15-18, Lines 21-24 of Claim 1 should read:

a microcontroller connected to a voltage at the third node, a ground connection of the microcontroller being connected to the fourth node, the microcontroller being configured to:

Signed and Sealed this
Thirtieth Day of May, 2017

Michelle K. Lee
*Director of the United States Patent and Trademark Office*